US012068760B2

(12) United States Patent
Ren et al.

(10) Patent No.: US 12,068,760 B2
(45) Date of Patent: Aug. 20, 2024

(54) CONTINUOUS-TIME SIGMA DELTA ANALOG-TO-DIGITAL CONVERTER

(71) Applicant: Analog Devices International Unlimited Company, Limerick (IE)

(72) Inventors: Naiqian Ren, Limerick (IE); Roberto Sergio Matteo Maurino, Turin (IT)

(73) Assignee: Analog Devices International Unlimited Company, Limerick (IE)

( * ) Notice: Subject to any disclaimer, the term of this patent is extended or adjusted under 35 U.S.C. 154(b) by 156 days.

(21) Appl. No.: 17/809,488

(22) Filed: Jun. 28, 2022

(65) Prior Publication Data

US 2023/0421171 A1 Dec. 28, 2023

(51) Int. Cl.
*H03M 3/00* (2006.01)
(52) U.S. Cl.
CPC ............ *H03M 3/464* (2013.01); *H03M 3/326* (2013.01); *H03M 3/356* (2013.01); *H03M 3/39* (2013.01); *H03M 3/422* (2013.01); *H03M 3/454* (2013.01)
(58) Field of Classification Search
CPC ........ H03M 3/464; H03M 3/39; H03M 3/422; H03M 3/326; H03M 3/356; H03M 3/454
See application file for complete search history.

(56) References Cited

U.S. PATENT DOCUMENTS

| 7,495,589 | B1 | 2/2009 | Trifonov et al. |
| 7,554,072 | B2 | 6/2009 | Schmidt |
| 7,808,408 | B2 | 10/2010 | Madisetti et al. |
| 9,065,477 | B2 | 6/2015 | Rajasekhar et al. |
| 10,763,881 | B1 | 9/2020 | Nittala et al. |
| 2014/0035770 | A1* | 2/2014 | Wulff ............... H03M 3/39 341/143 |

FOREIGN PATENT DOCUMENTS

| CN | 117318725 A | 12/2023 |
| DE | 102023116429 A1 | 12/2023 |

OTHER PUBLICATIONS

"Chinese Application Serial No. 202310692783.3, Voluntary Amendment filed Mar. 19, 2024".

* cited by examiner

*Primary Examiner* — Joseph J Lauture
(74) *Attorney, Agent, or Firm* — Schwegman Lundberg & Woessner, P.A.

(57) ABSTRACT

Techniques to deliver a precision low noise reference voltage to a precision analog-to-digital converter without the need of a reference buffer or digital correction. In an example, a technique can use an integrated resistor divider and external capacitor to derive a low noise precision reference voltage either from the power supply of the ADC, or from an integrated reference source.

20 Claims, 7 Drawing Sheets

CONTINUOUS-TIME SIGMA DELTA ANALOG-TO-DIGITAL CONVERTER

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics may be provided with one or more sensors to make measurements, and these sensors may generate an analog signal. The analog signal may then be provided to an analog-to-digital converter (ADC) as input to generate a digital output signal for further processing. In another instance, in a mobile device receiver, an antenna may generate an analog signal based on the electromagnetic waves carrying information/signals in the air. The analog signal generated by the antenna may then be provided as input to an ADC to generate a digital output signal for further processing.

A difference between the input voltage and the output voltage of the ADC may correspond to the quantization error of the ADC. In some ADCs, the quantization error may be further processed by ADC circuitry to "shape" the quantization error, which appears as quantization noise in the frequency domain. Noise shaping techniques may push the quantization noise away from the signal band of interest and into higher frequencies, for example.

A sigma-delta modulator is a feedback system that may achieve high-resolution digital signals. Sigma-delta modulators have been implemented in a wide variety of electronic circuits, including but not limited to, analog-to-digital converters (ADCs), digital-to-analog converters (DACs), frequency synthesizers, and other electronic circuits.

ADCs based on sigma-delta modulation have been widely used in digital audio and high precision instrumentation systems. Typically, a sigma-delta ADC encodes an analog signal using a sigma-delta modulator (e.g., using a low resolution ADC such as a 1-bit ADC, Flash ADC, low resolution successive approximation register (SAR), etc.) and then, if applicable, applies a digital filter to the output of the sigma-delta modulator to form a higher-resolution digital output. A loop filter may be provided to provide error feedback to the sigma-delta modulator. One characteristic of a sigma-delta modulator is its noise shaping capability. As a result, sigma-delta ADCs are generally able to achieve high resolution analog-to-digital conversion.

SUMMARY OF THE DISCLOSURE

This disclosure describes, among other things, techniques to deliver a precision low noise reference voltage to a precision ADC without the need of a reference buffer or digital correction. In an example, the technique can use an integrated resistor divider and external capacitor to derive a low noise precision reference voltage either from the power supply of the ADC, or from an integrated reference source.

In some aspects, this disclosure is directed to a circuit comprising: a continuous-time sigma delta analog-to-digital converter (ADC) including a voltage divider circuit that is internal to the ADC, the voltage divider circuit including a first resistive element coupled to a resistive input of a digital-to-analog converter (DAC), wherein the ADC is configured to receive an analog input voltage at an input terminal and compare the analog input voltage to a voltage reference, wherein the voltage reference is generated either by the voltage divider circuit or by a voltage reference circuit external to the ADC; the first resistive element having a first end to couple to a power supply of the ADC; the resistive input of the DAC having a first end and a second end, wherein the first end of the resistive input of the DAC is configured to be coupled to a second end of the first resistive element, and wherein the second end of the resistive input of the DAC is configured to couple to a reference voltage; a control circuit; and a switching element coupled between the second end of the first resistive element and the first end of the resistive input of the DAC, the switching element having an open state and a closed state, wherein the control circuit is configured to operate the switching element.

In some aspects, this disclosure is directed to a method of operating a continuous-time sigma delta analog-to-digital converter (ADC), the method comprising: coupling a voltage divider circuit internal to the ADC, including: coupling a first resistive element to a resistive input of a digital-to-analog converter (DAC), wherein the ADC is configured to receive an analog input voltage at an input terminal and compare the analog input voltage to a voltage reference, wherein the voltage reference is generated either by the voltage divider circuit or by a voltage reference circuit external to the ADC; coupling a first end of the first resistive element to a power supply of the ADC; and coupling a first end of the resistive input of the DAC to a second end of the first resistive element and coupling a second end of the resistive input of the DAC to a reference voltage; coupling a switching element between the second end of the first resistive element and the first end of the resistive input of the DAC, the switching element having an open state and a closed state; and controlling an operation of the switching element.

In some aspects, this disclosure is directed to a circuit comprising: a continuous-time sigma delta analog-to-digital converter (ADC) including a voltage divider circuit that is internal to the ADC, the voltage divider circuit including a first resistive element coupled to a resistive input of a digital-to-analog converter (DAC), wherein the ADC is configured to receive an analog input voltage at an input terminal and compare the analog input voltage to a voltage reference, wherein the voltage reference is generated by the voltage divider circuit; the first resistive element having a first end to couple to a power supply of the ADC; the resistive input of the DAC having a first end and a second end, wherein the first end of the resistive input of the DAC is configured to be coupled to a second end of the first resistive element, and wherein the second end of the resistive input of the DAC is configured to couple to a reference voltage; a control circuit; and a switching element coupled between the second end of the first resistive element and the first end of the resistive input of the DAC, the switching element having an open state and a closed state, wherein the control circuit is configured to operate the switching element.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized that existing techniques have limitations in delivering a precision reference voltage to a precision analog-to-digital converter (ADC). For discrete-time ADCs, the challenge comes from both settling the reference input and filtering the reference source noise. Discrete-time ADCs use a switched-capacitor sample-and-hold type of input on both the ADC input and the reference inputs. The switching action can generate a disturbance, such as charge injection, at reference input. The charge injection can generate a voltage disturbance on the reference input because the reference source does not have zero output impedance.

A traditional way of solving the problem is to use a reference buffer circuit that has low output impedance and high bandwidth to overdrive the reference input to ensure that the voltage disturbance caused by the charge injection will not cause any accuracy error beyond the desired accuracy of the ADC. A reference buffer amplifier is almost always needed to achieve the desired performance. But the buffer adds power, area, noise, and DC error.

For a continuous-time sigma delta (CTSD) ADC, the reference input settling issue is alleviated. CTSD ADC circuits includes inputs coupled to resistive elements (also referred to as "resistive input ADCs"), which can make them easy to drive and can provide inherent anti-aliasing properties. CTSD ADCs have pure resistive inputs so there is no need to overdrive the ADC input or reference input to overcome issues from charge injection. The resistive reference input of the CTSD no longer requires a high bandwidth buffer amplifier to drive. But the noise filtering issue still exists and there is no good solution but to re-introduce the reference buffer to construct a filter. Again, the buffer adds power, area, noise, and DC error.

This disclosure describes, among other things, techniques to deliver a precision low noise reference voltage to a precision ADC without the need of a reference buffer or digital correction. In an example, the technique can use an integrated resistor divider and external capacitor to derive a low noise precision reference voltage either from the power supply of the ADC, or from an integrated reference source.

In some examples, these techniques can take the advantage of the resistive input of the CTSD ADC and the excellent matching property of the integrated resistor networks to create a precision reference voltage from another source. In addition, the techniques can use the internal resistor with an external capacitor to form a RC filter to help limit the wide band noise from the source voltage and the internal resistor. In some examples, an additional servo amp can be included to help reduce the reference voltage error introduced by the input voltage common mode variation.

Figure 1:
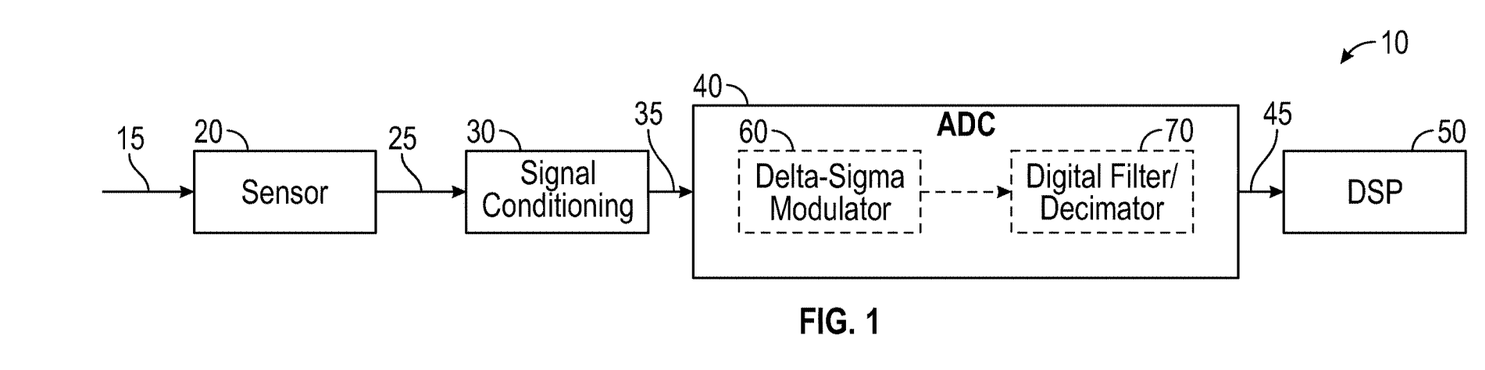
FIG. 1 is a schematic block diagram of an example of a data acquisition system, which can implement a sigma-delta modulator.

FIG. 1 is a schematic block diagram of an example of a data acquisition system 10, which can implement a sigma-delta modulator. The data acquisition system 10 can be an electronic device (including an electronic circuit and/or one or more components) configured to convert signals (such as analog signals) into a usable form. In various implementations, the data acquisition system 10 can convert physical conditions into digital form, which can be stored and/or analyzed. FIG. 1 has been simplified for the sake of clarity. Additional features can be added in the data acquisition system 10, and some of the features described can be replaced or eliminated in other embodiments of the data acquisition system 10.

In FIG. 1, the data acquisition system 10 can include an input signal 15 that represents a physical condition, such as temperature, pressure, velocity, flow rate, position, other physical condition, or combination thereof. A sensor circuit block 20 can receive an input signal 15 and convert the physical condition (represented by input signal 15) into an electrical signal, such as an analog signal 25. The analog signal 25 can be a voltage or current that represents the physical condition (represented by the input signal 15).

A signal conditioning circuit block 30 can receive and adjust the analog signal 25 within an acceptable range of an analog-to-digital converter (ADC), providing a conditioned analog signal 35. The conditioned analog signal 35 can be provided at ADC circuit block 40, such that the signal conditioning circuit block 30 can act as an interface between the sensor circuit block 20 and the ADC circuit block 40, the conditioning analog signal 25 (and thus providing the conditioned analog signal 35) before the ADC circuit block 40 digitizes the analog signal. The signal conditioning circuit block 30 can amplify, attenuate, filter, and/or perform other conditioning functions to the analog signal 25. The ADC circuit block 40 can receive and convert the conditioned analog signal 35 into digital form, providing a digital signal 45. The digital signal 45 can represent the physical quantity received by the sensor via the input signal 15. A digital signal processor (DSP) circuit block 50 can receive and process digital signal 45.

The ADC circuit block 40 can include a sigma-delta ADC that generates a digital signal using a feedback technique, where the sigma-delta ADC can oversample its input signal (here, the conditioned analog signal 35) and perform noise-shaping to achieve a high-resolution digital signal (here, the digital signal 45). The sigma-delta ADC can include a sigma-delta modulator 60 and a digital filter/decimator 70. The sigma-delta modulator 60 can use oversampling (for example, a sampling rate above Nyquist rate) and filtering to generate a digital signal that represents the input signal received by the sigma-delta ADC (such as the conditioned analog signal 35).

In various implementations, the sigma-delta ADC feedback loop forces the output of the modulator to be a good representation of the input signal in the bandwidth of interest. The digital filter/decimator 70 can attenuate noise and/or reduce a data rate (for example, to a Nyquist sampling rate) of the digital signal, providing the digital signal 45. The digital filter/decimator 70 can include a digital filter, a decimator, or both. The digital filter can attenuate the digital signal received from the sigma-delta modulator 60, and the decimator can reduce a sampling rate of the digital signal received from the sigma-delta modulator 60.

Figure 2:
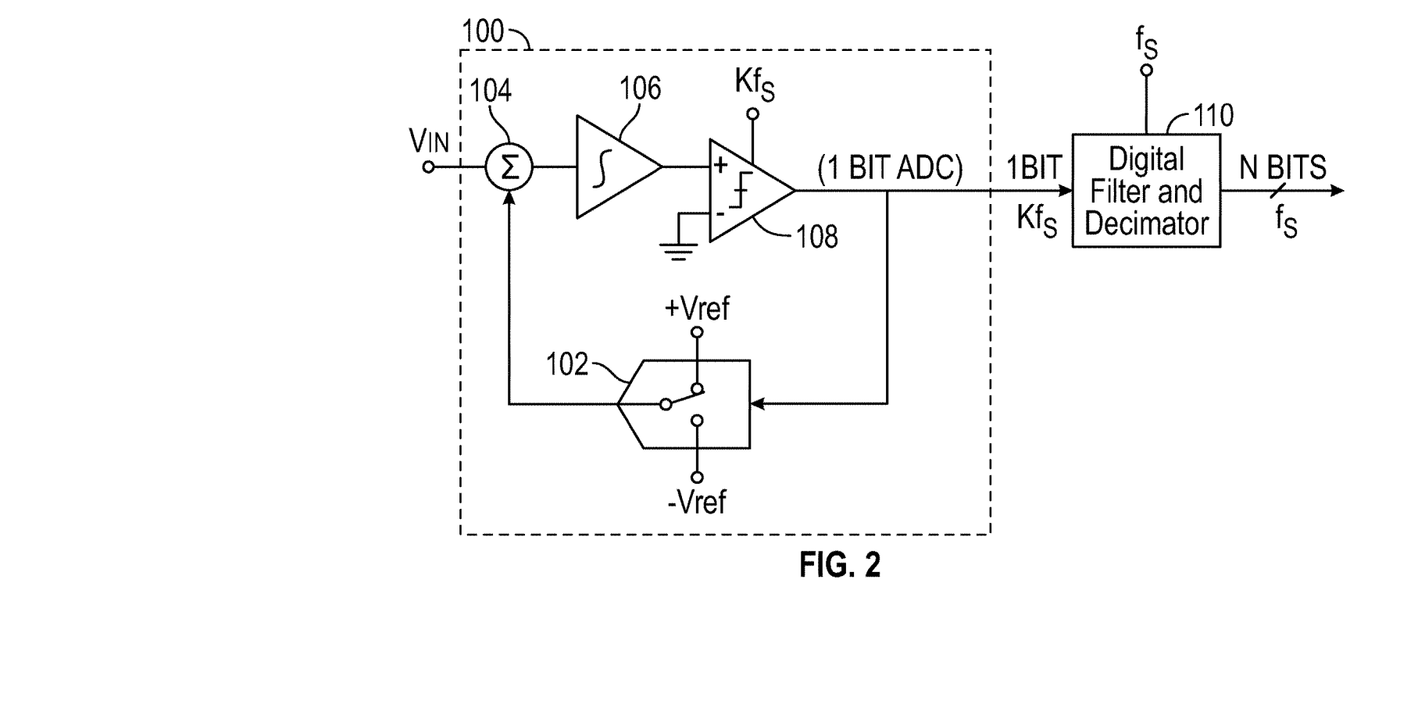
FIG. 2 is a block diagram of an example of a first-order single-bit sigma-delta ADC.

FIG. 2 is a block diagram of an example of a first-order single-bit sigma-delta ADC. The sigma-delta modulator 100 can be an example of the sigma-delta modulator 60 of FIG. 1. The sigma-delta modulator 100 can convert an input signal (Vin) into a continuous serial stream of ones and zeros at a rate determined by a sampling clock frequency $Kf_S$. A one-bit digital-to-analog converter (DAC) 102 can be driven by the serial output data stream to generate a feedback signal. The output of the digital-to-analog converter (DAC) 102 can be subtracted from the input signal using a summing element 104. The summing element 104 can be implemented as the summing node of an operational amplifier (op amp), such as the op amp of an integrator 106.

The integrator 106 can integrate the output of summing element 104, and the output of the integrator 106 can be applied to a clocked latched comparator 108. For an input signal of zero, the comparator output can include an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output can be applied to a digital filter and decimator 110 that averages every M cycles, where M is a positive integer greater than 1. The digital filter and decimator 110 can be an example of the digital filter/decimator 70 of FIG. 1. The decimator reduces the effective sampling rate at the output to the sampling rate fs.

Figure 3:
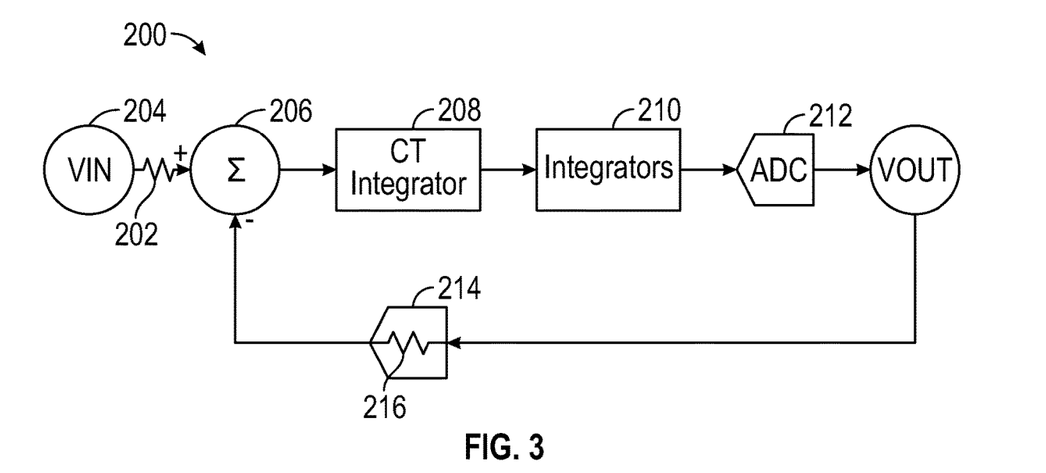
FIG. 3 is an example of a continuous-time sigma delta ADC that can implement various techniques of this disclosure.

FIG. 3 is an example of a continuous-time sigma delta ADC 200 that can implement various techniques of this disclosure. The CTSD ADC 200 can include a resistive input, represented by a resistor 202, to receive an analog input signal 204, such as a voltage VIN. The CTSD ADC 200 can include a summing circuit 206, a continuous-time integrator 208, one or more integrators 210, an analog-to-digital converter (ADC) 212, and a digital-to-analog converter (DAC) 214, such as a resistive DAC. An intrinsic resistance of the DAC 214 is represented by a resistor 216.

The summing circuit 206 can receive the analog input signal 204. The output of the summing circuit 206 can be coupled to an input of the continuous-time integrator 208. The output of the continuous-time integrator 208 can be coupled to the input of the integrator(s) 210, which can be one or more integrators. Other integrators can be used in subsequent stages, and these other integrators can be continuous-time integrators, or partly continuous-time and partly switched capacitor in a hybrid implementation. The output of the integrators 210 can be connected to the inputs of the ADC 212, which can be a one-bit or multi-bit ADC that acts as a quantizer. The output of ADC 212 forms an output signal 218 and also can be input into the DAC 214.

As mentioned above, this disclosure describes, among other things, techniques to deliver a precision low noise reference voltage to a precision ADC, such as a CTSD ADC, e.g., the CTSD ADC 200 of FIG. 3, without the need of a buffer or digital correction. In an example, the technique can use an integrated resistor divider and external capacitor to derive a low noise precision reference voltage either from the power supply of the ADC, or from an integrated reference source, such as shown in FIGS. 4 and 5.

Figure 4:
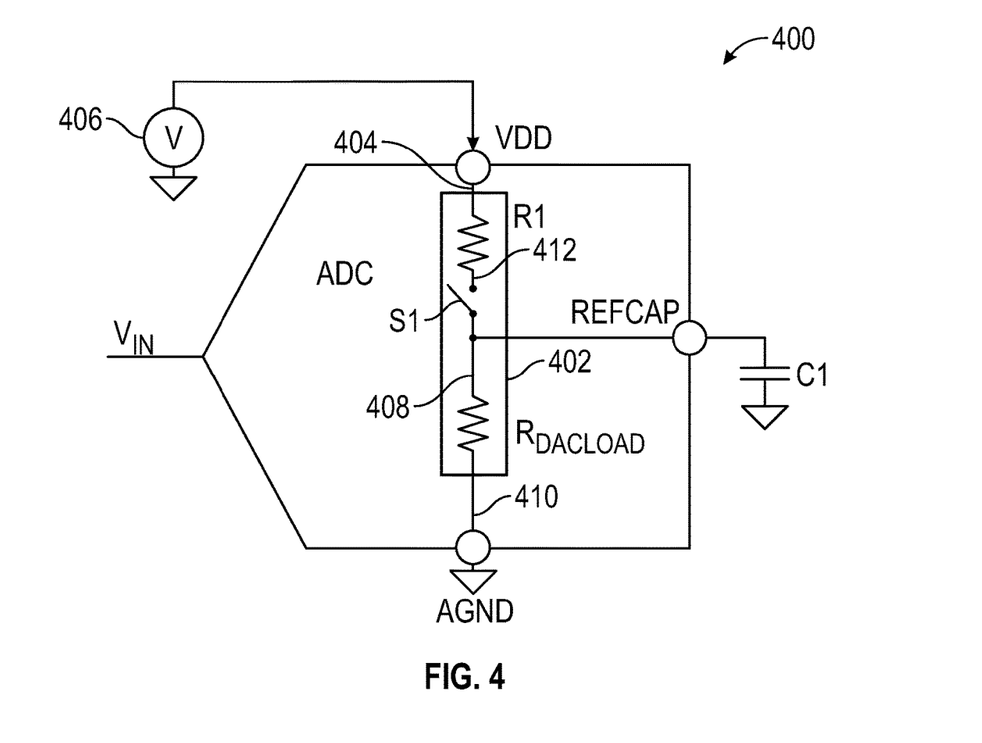
FIG. 4 is an example of a continuous-time sigma delta ADC that can implement various techniques of this disclosure.
Figure 5:
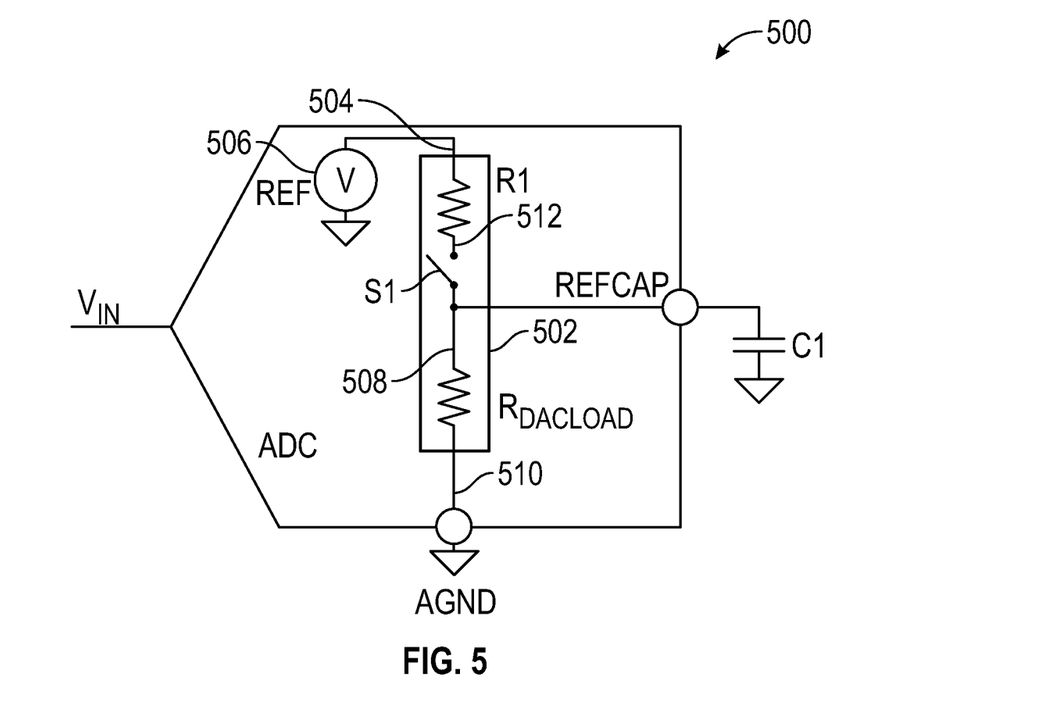
FIG. 5 is another example of a continuous-time sigma delta ADC that can implement various techniques of this disclosure.

FIG. 4 is an example of a CTSD ADC 400 that can implement various techniques of this disclosure. The CTSD ADC 400 can include an internal voltage divider circuit 402 that is internal to the ADC. The voltage divider circuit 402 can include an internal first resistive element R1 coupled to a resistive input $R_{DACLOAD}$ of the DAC digital-to-analog converter (DAC). The resistive input $R_{DACLOAD}$ is represented by the resistor 216 in FIG. 3. The CTSD ADC 400 is configured to receive an analog input voltage VIN at an input terminal and compare the input voltage VIN to a voltage reference REFCAP, where the voltage reference REFCAP is generated by the voltage divider circuit 402.

The first resistive element R1, e.g., resistor, has a first end 404 to couple to a power supply 406 of the ADC. As seen in FIG. 4, the power supply 406 is a voltage source that is external to the ADC, e.g., an IC supply voltage. The resistive input $R_{DACLOAD}$ of the DAC has a first end 408 and a second end 410, where the first end 408 of the resistive input $R_{DACLOAD}$ of the DAC is configured to be coupled to a second end 412 of the first resistive element R1 and configured to couple to a capacitor C1 that is external to the ADC, such as to filter reference noise. The capacitor C1 can be sized depending on a desired noise performance. The second end 410 of the resistive input $R_{DACLOAD}$ of the DAC is configured to couple to a reference voltage, such as a ground reference (AGND).

In some examples, the switching element R1 can have an on-resistance that is proportional to a resistance of the resistive input $R_{DACLOAD}$ of the DAC.

By using these techniques, no reference buffer amplifier is needed. In addition, these techniques can bandlimit the reference source noise. Further, these techniques can provide low gain error and gain error drift, e.g., R1 can be made to track $R_{DACLOAD}$. Finally, the techniques can allow a ratiometric measurement using a ratiometric sensor if the input signal VIN and the supply voltage VDD are also ratiometric.

As described in more detail below, the CTSD ADC 400 can also include a switching element S1, such as a transistor, e.g., a field-effect transistor (FET).

FIG. 5 is another example of a CTSD ADC 500 that can implement various techniques of this disclosure. The CTSD ADC 500 is similar to the CTSD ADC 400 of FIG. 4, but the CTSD ADC 500 has an integrated reference source.

The CTSD ADC 500 can include an internal voltage divider circuit 502 that is internal to the ADC. The voltage divider circuit 502 can include an internal first resistive element R1 coupled to a resistive input $R_{DACLOAD}$ of the DAC digital-to-analog converter (DAC). The resistive input $R_{DACLOAD}$ is represented by the resistor 216 in FIG. 3. The CTSD ADC 500 is configured to receive an analog input voltage VIN at an input terminal and compare the input voltage VIN to a voltage reference REFCAP, where the voltage reference REFCAP is generated by the voltage divider circuit 502.

The first resistive element R1 has a first end 504 to couple to a power supply 506 of the ADC. As seen in FIG. 5, the power supply 406 is a voltage source that is internal to the ADC, e.g., an integrated reference source. The resistive input $R_{DACLOAD}$ of the DAC has a first end 508 and a second end 510, where the first end 508 of the resistive input $R_{DACLOAD}$ of the DAC is configured to be coupled to a second end 512 of the first resistive element R1 and configured to couple to a capacitor C1 that is external to the ADC, such as to filter reference noise. The second end 510 of the resistive input $R_{DACLOAD}$ of the DAC is configured to couple to a reference voltage, such as a ground reference (AGND).

By using these techniques, no reference buffer amplifier is needed. In addition, these techniques can bandlimit the reference source noise. Further, these techniques can provide low gain error and gain error drift, e.g., R1 can be made to track $R_{DACLOAD}$. Finally, any drop in the resistance of R1 can be compensated by increasing the voltage of higher reference source 506.

Figure 6:
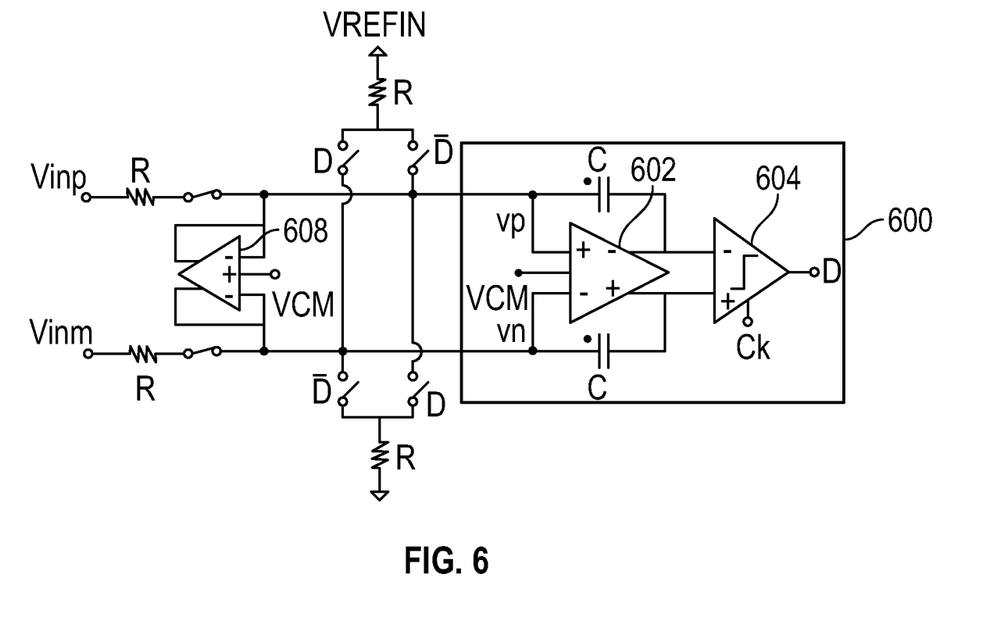
FIG. 6 is an example of an amplifier circuit configured to generate a common mode voltage and provide common mode voltage to an amplifier circuit of an integrator circuit of a continuous-time sigma delta ADC.

FIG. 6 is an example of an amplifier circuit configured to generate a common mode voltage and provide common mode voltage an amplifier circuit of an integrator circuit of a CTSD ADC. The integrator circuit 600 includes an amplifier circuit 602 coupled to a comparator circuit 604.

The amplifier circuit 602 is configured to receive voltages vp, vn. If the amplifier circuit 608 is not present, depending on the input common mode voltage (CM) of the circuit, the common mode on the voltages vp, vn can be changing. This in turn changes the load current from the reference voltage VREFIN. Only common mode signals affect the current from the voltage reference $V_{REFIN}$ (the reference voltage at the ADC pin). Without the amplifier circuit 608 the CTSD input common mode (Vinp+Vinm)/2 changes the current taken from the voltage reference $V_{REFIN}$.

If the voltage reference $V_{REFIN}$ is driven with low impedance, then the voltage reference $V_{REFIN}$ stays constant. However, any resistance in series with the $V_{REFIN}$ pin will introduce an ADC voltage reference change (gain error) dependent on the CTSD input (Vinp+Vinm)/2, such as a common mode rejection ratio (CMRR) error.

When the common mode voltage changes, the voltages vp, vn change, so the voltage drop between $V_{REFIN}$ and vp, vn changes. As such, there is a different load current, which passes through the R1 resistor in FIGS. 4 and 5 to produce a reference voltage $V_{REFIN}$ caused by the modulation of the load current.

To solve this problem, the inventors recognized that an amplifier circuit 608, e.g., a servo amplifier, can be included to drive the common mode voltage at the input of the amplifier circuit 602 to a desired voltage VCM, such as $V_{REFIN}/2$. The amplifier circuit 608 is configured to generate a common mode voltage VCM, which is applied to both differential inputs vp and vn of the amplifier circuit 602 of the integrator circuit 600. The common mode voltage VCM can be proportional to the reference voltage $V_{REFIN}$, which can be a reference voltage for the DAC.

In this manner, the CTSD input common mode voltage (Vinp+Vinm)/2 does not change the current flowing through the resistor R1, because the common mode voltage at the amplifier circuit 602 is driven by the common mode amplifier circuit 608. In some examples, the common mode voltage VCM can be derived from the reference voltage VDD ratiometrically, which can allow ratiometric measurements when an input signal VIN is ratiometric to the voltage VDD.

Figure 8:
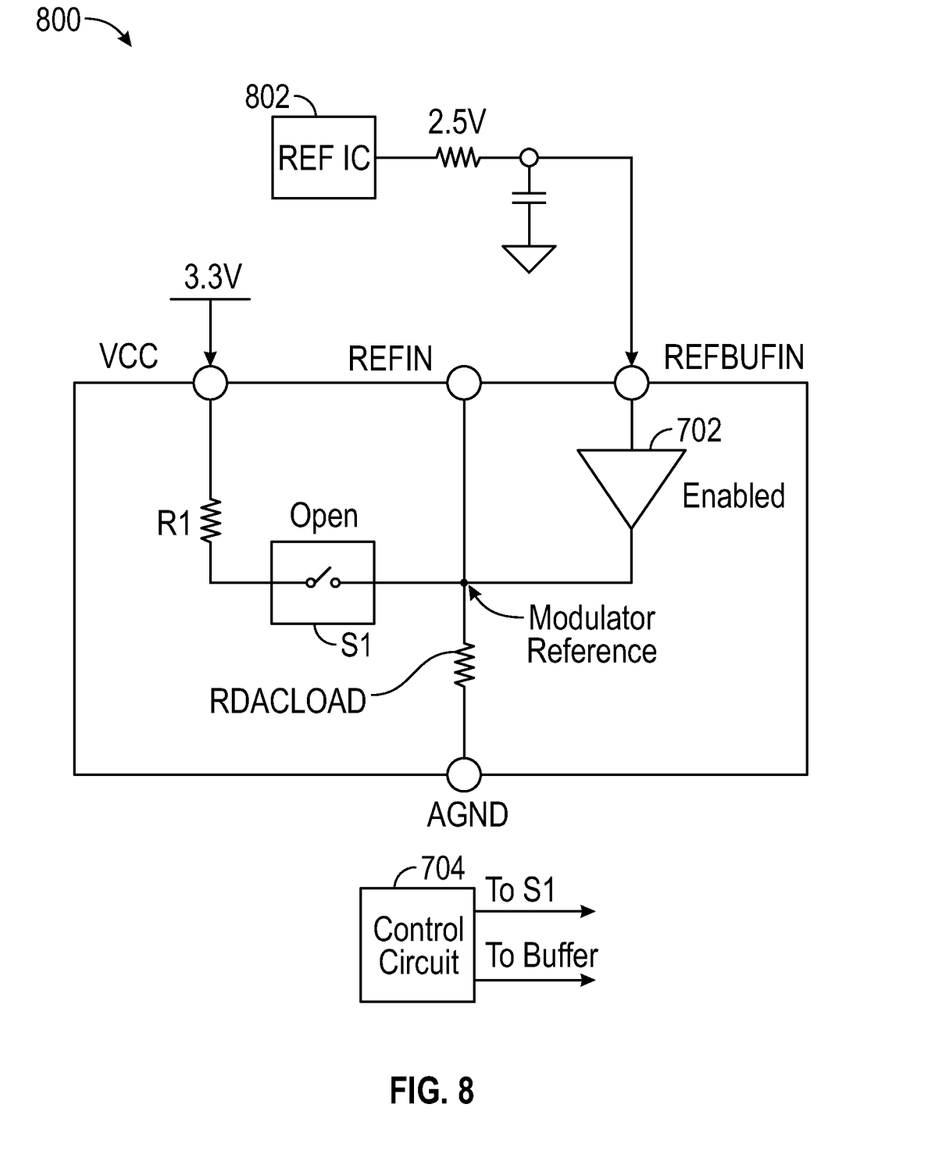
FIG. 8 is another example of a continuous-time sigma delta ADC that can implement various techniques of this disclosure.
Figure 9:
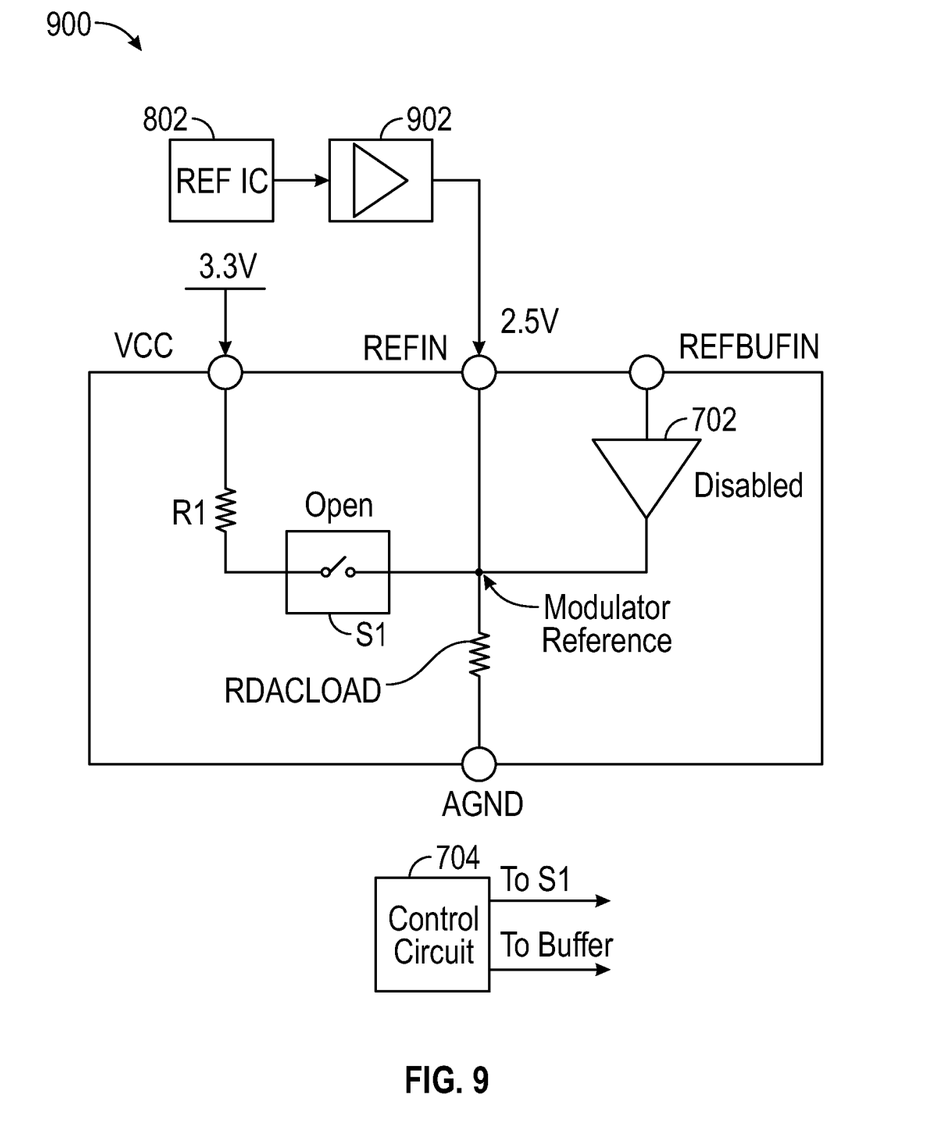
FIG. 9 is another example of a continuous-time sigma delta ADC that can implement various techniques of this disclosure.

The techniques described above, such as with respect to FIGS. 4 and 5, eliminate the need for a reference buffer. That is, the techniques of FIGS. 4 and 5 can use an integrated resistor divider and external capacitor to derive a low noise precision reference voltage either from the power supply of the ADC, or from an integrated reference source. Nevertheless, in some implementations, it can be desirable to include a reference buffer circuit that can be enabled or disabled, as desired by the user. Examples of various user-configurable implementations are shown in FIGS. 7-9.

Figure 7:
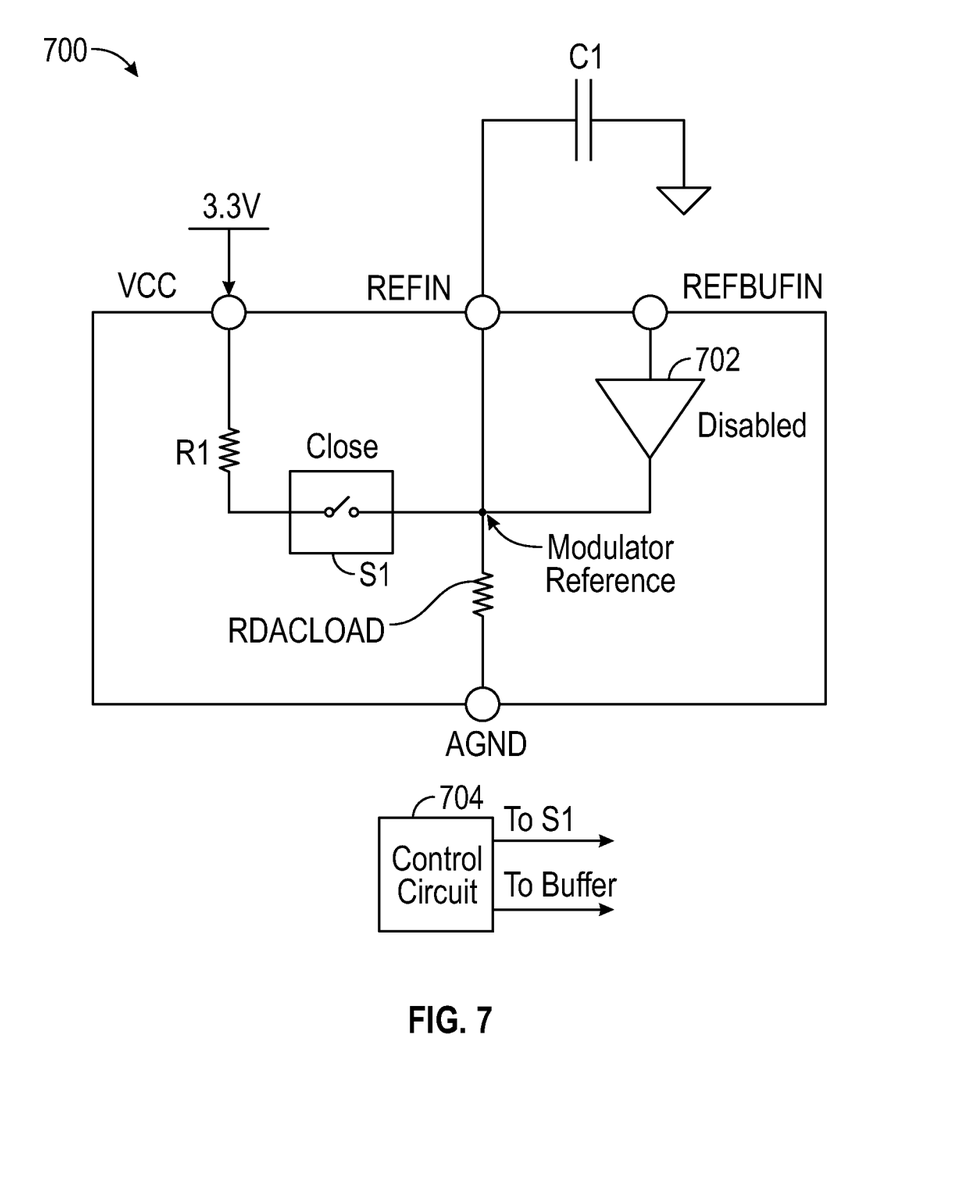
FIG. 7 is another example of a continuous-time sigma delta ADC that can implement various techniques of this disclosure.

FIG. 7 is another example of a CTSD ADC 700 that can implement various techniques of this disclosure. The CTSD ADC 700 can include an internal voltage divider circuit that is internal to the ADC. The voltage divider circuit can include an internal first resistive element R1 coupled to a resistive input $R_{DACLOAD}$ of the DAC digital-to-analog converter (DAC). The resistive input $R_{DACLOAD}$ is represented by the resistor 216 in FIG. 3. The CTSD ADC 700 is configured to receive an analog input voltage at an input terminal and compare the input voltage to a voltage reference.

The first resistive element R1 has a first end to couple to a power supply VDD of the ADC. The resistive input $R_{DACLOAD}$ of the DAC has a first end and a second end, where the first end of the resistive input $R_{DACLOAD}$ of the DAC is configured to be coupled to a second end of the first resistive element R1 via a switching element S1, such as a transistor, e.g., a field-effect transistor (FET). The switching element S1, which can have an open state or a closed state, can be coupled between the second end of the first resistive element R1 and the first end of the resistive input $R_{DACLOAD}$ of the DAC.

The first end of the resistive input $R_{DACLOAD}$ is also configured to couple to a capacitor C1 that is external to the ADC, such as to filter reference noise. The second end of the resistive input $R_{DACLOAD}$ of the DAC is configured to couple to a reference voltage, such as a ground reference (AGND).

The CTSD ADC 700 can include a reference buffer circuit 702 that is internal to the ADC. A control circuit 704 can output a control signal to enable/disable the reference buffer circuit 702. In addition, the control circuit 704 is configured to output a control signal to operate the switching element S1. As an example, the control circuit 704 can include a register circuit configured to store a setting for configuring a state of the switching element S1.

As seen in FIG. 7, the switching element S1 is in the closed state and the control circuit 704 has disabled the reference buffer circuit 702. When the switching element S1 is in the closed state, the voltage reference ("modulator reference") is generated by the voltage divider circuit formed by R1 and $R_{DACLOAD}$.

FIG. 8 is another example of a CTSD ADC 800 that can implement various techniques of this disclosure. Some of the components of the CTSD ADC 800 are similar to components in the CTSD ADC 700 of FIG. 7 and, for purposes of conciseness, those components will not be described again.

The CTSD ADC 800 can include a reference buffer circuit 702 that is internal to the ADC. As seen in FIG. 8, the switching element S1 is in the open state and the control circuit 704 has enabled the reference buffer circuit 702. When the switching element S1 is in the open state, a voltage reference circuit 802 that is external to the ADC is configured to generate the voltage reference ("modulator reference").

FIG. 9 is another example of a CTSD ADC 900 that can implement various techniques of this disclosure. Some of the components of the CTSD ADC 900 are similar to components in the CTSD ADC 700 of FIG. 7 and the CTSD ADC 800 of FIG. 8, for purposes of conciseness, those components will not be described again.

The CTSD ADC 900 can include a reference buffer circuit 702 that is internal to the ADC and a reference buffer circuit 902 that is external to the ADC and coupled to a voltage reference circuit 802 that is external to the ADC. The reference buffer circuit 902 can include various components for filtering any noise of the voltage reference circuit 802.

As seen in FIG. 9, the switching element S1 is in the open state and the control circuit 704 has disabled the internal reference buffer circuit 702. When the switching element S1 is in the open state, the voltage reference circuit 802 that is external to the ADC is configured to generate the voltage reference ("modulator reference"), which can be buffered (and, optionally, filtered) by the reference buffer circuit 902.

Figure 10:
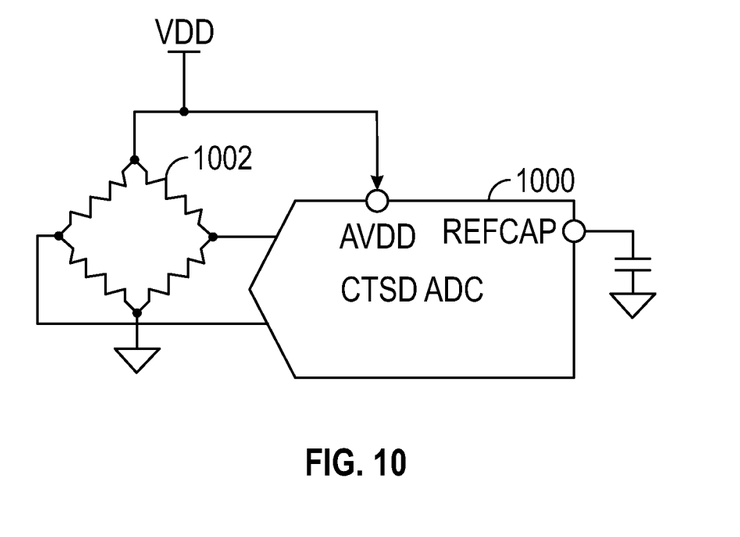
FIG. 10 is an example of a continuous-time sigma delta ADC in combination with a sensor.

FIG. 10 is an example of a CTSD ADC 1000 in combination with a sensor 1002. The CTSD ADC 1000 can implement the techniques of this disclosure, such as described above with respect to FIG. 7 where the switching element is in a closed state. In some examples, the sensor 1002 can be an external ratiometric sensor, such as a bridge sensor.

As seen in FIG. 10, the sensor 1002 operates using the same voltage supply VDD as the CTSD ADC 1000. The reference voltage of the CTSD ADC 1000 ("modulator reference" of FIG. 7) can change if the supply voltage VDD fluctuates. However, any change in the supply voltage VDD will also affect the reference voltage from the voltage divider circuit, such as formed by R1 and $R_{DACLOAD}$ in FIG. 7.

The output of the sensor 1002 is ratiometric to the supply voltage VDD. If the supply voltage varies, the output of the sensor 1002 varies accordingly in a fixed ratio. In other words, the output of the sensor 1002 tracks any changes in the supply voltage VDD. This combination of a ratiometric sensor and an ADC implementing various techniques of this disclosure provides a rejection of any variation in the supply voltage VDD.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A circuit comprising:
   a continuous-time sigma delta analog-to-digital converter (ADC) including a voltage divider circuit that is internal to the ADC, the voltage divider circuit including a first resistive element coupled to a resistive input of a digital-to-analog converter (DAC), wherein the ADC is configured to receive an analog input voltage at an input terminal and compare the analog input voltage to a voltage reference, wherein the voltage reference is generated either by the voltage divider circuit or by a voltage reference circuit external to the ADC;
   the first resistive element having a first end to couple to a power supply of the ADC;

the resistive input of the DAC having a first end and a second end, wherein the first end of the resistive input of the DAC is configured to be coupled to a second end of the first resistive element, and wherein the second end of the resistive input of the DAC is configured to couple to a reference voltage;
a control circuit; and
a switching element coupled between the second end of the first resistive element and the first end of the resistive input of the DAC, the switching element having an open state and a closed state, wherein the control circuit is configured to operate the switching element.

2. The circuit of claim 1, wherein the voltage reference is external to the ADC.

3. The circuit of claim 1, wherein the voltage reference is internal to the ADC.

4. The circuit of claim 1, comprising:
an integrator circuit having a first amplifier circuit; and
a second amplifier circuit to generate a common mode voltage, wherein the first amplifier circuit is configured to receive the common mode voltage.

5. The circuit of claim 1, comprising:
a reference buffer circuit.

6. The circuit of claim 1, comprising:
a reference buffer circuit that is internal to the ADC,
wherein, when the switching element is in the closed state, the control circuit is configured to disable the reference buffer circuit, and
wherein the voltage reference is generated by the voltage divider circuit.

7. The circuit of claim 1, comprising:
a reference buffer circuit that is internal to the ADC,
wherein, when the switching element is in the open state, the control circuit is configured to enable the reference buffer circuit, and
wherein the voltage reference circuit external to the ADC is configured to generate the voltage reference.

8. The circuit of claim 1, comprising:
a reference buffer circuit that is internal to the ADC
a reference buffer circuit that is external to the ADC and coupled to the voltage reference circuit external to the ADC,
wherein, when the switching element is in the open state, the control circuit is configured to disable the reference buffer circuit that is internal to the ADC, and
wherein the voltage reference circuit external to the ADC is configured to generate the voltage reference.

9. The circuit of claim 1, in combination with a ratiometric sensor.

10. The circuit of claim 1, wherein the switching element has an on-resistance that is proportional to a resistance of the resistive input of the DAC.

11. The circuit of claim 1, wherein the voltage reference is generated by the voltage divider circuit.

12. The circuit of claim 1, wherein the voltage reference is generated by the voltage reference circuit external to the ADC.

13. A method of operating a continuous-time sigma delta analog-to-digital converter (ADC), the method comprising:
coupling a voltage divider circuit internal to the ADC, including:
coupling a first resistive element to a resistive input of a digital-to-analog converter (DAC), wherein the ADC is configured to receive an analog input voltage at an input terminal and compare the analog input voltage to a voltage reference, wherein the voltage reference is generated either by the voltage divider circuit or by a voltage reference circuit external to the ADC;
coupling a first end of the first resistive element to a power supply of the ADC; and
coupling a first end of the resistive input of the DAC to a second end of the first resistive element and coupling a second end of the resistive input of the DAC to a reference voltage;
coupling a switching element between the second end of the first resistive element and the first end of the resistive input of the DAC, the switching element having an open state and a closed state; and
controlling an operation of the switching element.

14. The method of claim 13, wherein the continuous-time sigma delta ADC includes an integrator circuit having a first amplifier circuit, the method comprising:
generating, by a second amplifier circuit, a common mode voltage; and
applying the common mode voltage to the first amplifier circuit.

15. The method of claim 13, wherein the continuous-time sigma delta ADC includes an internal reference buffer circuit, the method comprising:
disabling the reference buffer circuit;
controlling the operation of the switching element to place the switching element in the closed state; and
generating the voltage reference by the voltage divider circuit.

16. The method of claim 13, wherein the continuous-time sigma delta ADC includes an internal reference buffer circuit, the method comprising:
enabling the reference buffer circuit;
controlling the operation of the switching element to place the switching element in the open state; and
generating the voltage reference by the voltage reference circuit external to the ADC.

17. The method of claim 13, wherein the continuous-time sigma delta ADC includes an internal reference buffer circuit and a reference buffer circuit that is external to the ADC and coupled to the voltage reference circuit external to the ADC, the method comprising:
disabling the reference buffer circuit;
controlling the operation of the switching element to place the switching element in the open state; and
generating the voltage reference by the voltage reference circuit external to the ADC.

18. A circuit comprising:
a continuous-time sigma delta analog-to-digital converter (ADC) including a voltage divider circuit that is internal to the ADC, the voltage divider circuit including a first resistive element coupled to a resistive input of a digital-to-analog converter (DAC), wherein the ADC is configured to receive an analog input voltage at an input terminal and compare the analog input voltage to a voltage reference, wherein the voltage reference is generated by the voltage divider circuit;
the first resistive element having a first end to couple to a power supply of the ADC;
the resistive input of the DAC having a first end and a second end, wherein the first end of the resistive input of the DAC is configured to be coupled to a second end of the first resistive element, and wherein the second end of the resistive input of the DAC is configured to couple to a reference voltage;
a control circuit; and
a switching element coupled between the second end of the first resistive element and the first end of the resistive input of the DAC, the switching element having an open state and a closed state, wherein the control circuit is configured to operate the switching element.

19. The circuit of claim 18, comprising:
an integrator circuit having a first amplifier circuit; and
a second amplifier circuit to generate a common mode voltage, wherein the first amplifier circuit is configured to receive the common mode voltage.

20. The circuit of claim 19, comprising:
a reference buffer circuit.

* * * * *